(12) United States Patent
Lee et al.

(10) Patent No.: US 10,658,610 B2
(45) Date of Patent: May 19, 2020

(54) DISPLAY APPARATUS

(71) Applicant: Samsung Display Co., Ltd., Yongin-Si, Gyeonggi-Do (KR)

(72) Inventors: Sungsoo Lee, Suwon-si (KR); Heesook Yoon, Yongin-si (KR); Tetsuji Kamine, Asan-si (KR)

(73) Assignee: Samsung Display Co., Ltd. (KR)

( * ) Notice: Subject to any disclaimer, the term of this patent is extended or adjusted under 35 U.S.C. 154(b) by 23 days.

(21) Appl. No.: 15/999,555

(22) Filed: Aug. 20, 2018

(65) Prior Publication Data

US 2019/0058148 A1 Feb. 21, 2019

(30) Foreign Application Priority Data

Aug. 21, 2017 (KR) .................. 10-2017-0105689

(51) Int. Cl.
*H01L 51/52* (2006.01)
*H01L 51/56* (2006.01)
*H01L 27/32* (2006.01)
*G09G 3/3225* (2016.01)
*C09J 7/29* (2018.01)
*G06F 3/041* (2006.01)
*G06F 1/16* (2006.01)

(52) U.S. Cl.
CPC .............. *H01L 51/524* (2013.01); *C09J 7/29* (2018.01); *G06F 1/1643* (2013.01); *G06F 3/0412* (2013.01); *G09G 3/3225* (2013.01); *H01L 27/323* (2013.01); *H01L 51/5246* (2013.01); *H01L 51/56* (2013.01); *G09G 2310/0264* (2013.01); *H01L 51/5253* (2013.01)

(58) Field of Classification Search
CPC ... H01L 51/524; H01L 51/5246; H01L 51/56; H01L 27/323; C09J 7/29; G06F 3/0412; G06F 3/3225
See application file for complete search history.

(56) References Cited

U.S. PATENT DOCUMENTS

| | | |
|---|---|---|
| 9,147,859 B2 | 9/2015 | Kim et al. |
| 2007/0013730 A1 | 1/2007 | Chang |
| 2010/0067726 A1* | 3/2010 | Suzuki .................. G06F 1/1605 381/333 |

(Continued)

FOREIGN PATENT DOCUMENTS

| | | |
|---|---|---|
| KR | 10-2015-0025388 A | 3/2015 |
| KR | 10-1521114 B1 | 5/2015 |
| KR | 10-1687206 B1 | 12/2016 |

*Primary Examiner* — Ariel A Balaoing
(74) *Attorney, Agent, or Firm* — Innovation Counsel LLP

(57) ABSTRACT

A display apparatus includes: a display member including a base substrate and a plurality of pixels disposed on the base substrate to display an image, a window member disposed on the display member and including a transparent part through which the image is transmitted and a bezel part disposed between the transparent part and the display member and contacting the transparent part, and a filling member disposed between the window member and the base substrate and contacting the bezel part. The bezel part includes a first layer contacting the transparent part and a second layer disposed between the first layer and the filling member. The second layer has an opening that overlaps the filling member in a plan view, and the filling member is disposed in the opening.

13 Claims, 16 Drawing Sheets

(56) References Cited

U.S. PATENT DOCUMENTS

| | | | |
|---|---|---|---|
| 2011/0291553 A1* | 12/2011 | Moon | H01L 51/5237 |
| | | | 313/504 |
| 2012/0170244 A1* | 7/2012 | Kwon | G06F 1/1637 |
| | | | 361/829 |
| 2014/0361958 A1* | 12/2014 | Cho | G09G 3/3208 |
| | | | 345/76 |
| 2017/0012235 A1* | 1/2017 | Kwon | H01L 51/5237 |
| 2017/0013730 A1 | 1/2017 | Chang | |
| 2017/0031202 A1* | 2/2017 | Lee | B32B 7/14 |

* cited by examiner

DISPLAY APPARATUS

CROSS-REFERENCE TO RELATED APPLICATIONS

This U.S. non-provisional patent application claims priority under 35 U.S.C. § 119 of Korean Patent Application No. 10-2017-0105689, filed on Aug. 21, 2017, the disclosure of which is hereby incorporated by reference in its entirety.

BACKGROUND

The present disclosure herein relates to a display apparatus, and more particularly, to a display apparatus including a window member with improved reliability.

Various display apparatuses used in multimedia apparatuses such as televisions, mobile phones, navigation devices, computer monitors, and game consoles are being developed. The display apparatuses are produced by assembling various components. The display apparatuses may be designed, taking into consideration of reliability in a process and reliability during use. In addition, the display apparatuses may be designed, taking into consideration of rework characteristic, which allows smooth replacement and reuse on the components.

SUMMARY

The present disclosure provides a display apparatus including a window member with improved rework characteristic and reliability in use.

An embodiment of the inventive concept provides a display apparatus including: a display member including a base substrate and a plurality of pixels disposed on the base substrate to display an image; a window member disposed on the display member and including a transparent part through which the image is transmitted and a bezel part disposed between the transparent part and the display member and contacting the transparent part; and a filling member disposed between the window member and the base substrate and contacting the bezel part, wherein the bezel part includes a first layer contacting the transparent part and a second layer disposed between the first layer and the filling member, the second layer has an opening that overlaps the filling member on a plane, and the filling member is disposed in the opening.

In an embodiment, the bezel part may have a front surface contacting the transparent part and a rear surface opposite to the front surface, the rear surface of the bezel part may be defined by a rear surface of the second layer and a surface exposed by the opening, and the filling member may contact the surface exposed by the opening.

In an embodiment, the filling member may entirely fill the opening.

In an embodiment, the rear surface of the second layer may have a surface area greater than that of the surface exposed by the opening.

In an embodiment, the second layer may include: a medium part having an adhesive material; and a plurality of particles dispersed in the medium part, wherein the rear surface of the second layer has an uneven surface formed by the particles.

In an embodiment, the second layer may have an adhesive material.

In an embodiment, the first layer may have a color, the second layer may contact the first layer to expose a portion of a rear surface of the first layer through the opening, and the filling member may contact the portion of the rear surface of the first layer exposed through the opening.

In an embodiment, the display apparatus may further include a cover layer disposed on the surface exposed by the opening, wherein the filling member may contact the cover layer.

In an embodiment, the cover layer may be attached to the first layer, and the second layer may be printed on the first layer.

In an embodiment, the filling member and the second layer may not overlap each other in a plan view.

In an embodiment, the display apparatus may further include an accommodating member that defines an internal space, accommodates the display member in the internal space, and is coupled to the window member, wherein the accommodating member may contact the second layer.

In an embodiment, the second layer may further have an adhesive material, and the accommodating member may be attached to the second layer.

In an embodiment, the filling member may have an adhesive material.

In an embodiment of the inventive concept, a display apparatus includes: a display member including a base substrate and a plurality of pixels disposed on the base substrate to display an image; a window member disposed on the display member and including a transparent part through which the image is transmitted and a bezel part that is disposed between the transparent part and the display member and includes a first surface contacting the transparent part and a second surface opposite to the first surface and having an adhesion property; and a filling member disposed between the window member and the base substrate and contacting the second surface.

In an embodiment, the display member may further include: a plurality of pads disposed on the base substrate and connected to the pixels, the pads overlapping the bezel part; and a circuit board connected to the pads, wherein the filling member is disposed to overlap the pads.

In an embodiment, the display apparatus may include a driving chip disposed on the base substrate, wherein the filling member covers at least a portion of the driving chip.

In an embodiment, the display apparatus may further include a plurality of sensors disposed on and overlapping the pixels to detect a touch applied externally; and a touch circuit board connected to the sensors to provide an electrical signal to the sensors, wherein the filling member includes a first filling member overlapping the driving chip, and a second filling member spaced apart from the first filling member and overlapping the touch circuit board.

In an embodiment, the second surface may include: a first portion contacting the filling member, and a second portion adjacent to the first portion and having an adhesion property higher than that of the first portion.

In an embodiment, the bezel part may include a plurality of stacked layers, and the first portion and the second portion may be defined on different slayers among the stacked layers.

In an embodiment, the first portion may have roughness lower than that of the second portion.

BRIEF DESCRIPTION OF THE FIGURES

The accompanying drawings are included to provide a further understanding of the inventive concept and are incorporated in and constitute a part of the present specification. The drawings illustrate exemplary embodiments of the inventive concept and, together with the description, serve to explain principles of the inventive concept. In the drawings.

DETAILED DESCRIPTION

Hereinafter, a display apparatus according to an embodiment of the inventive concept will be described with reference to the drawings.

Figure 1:
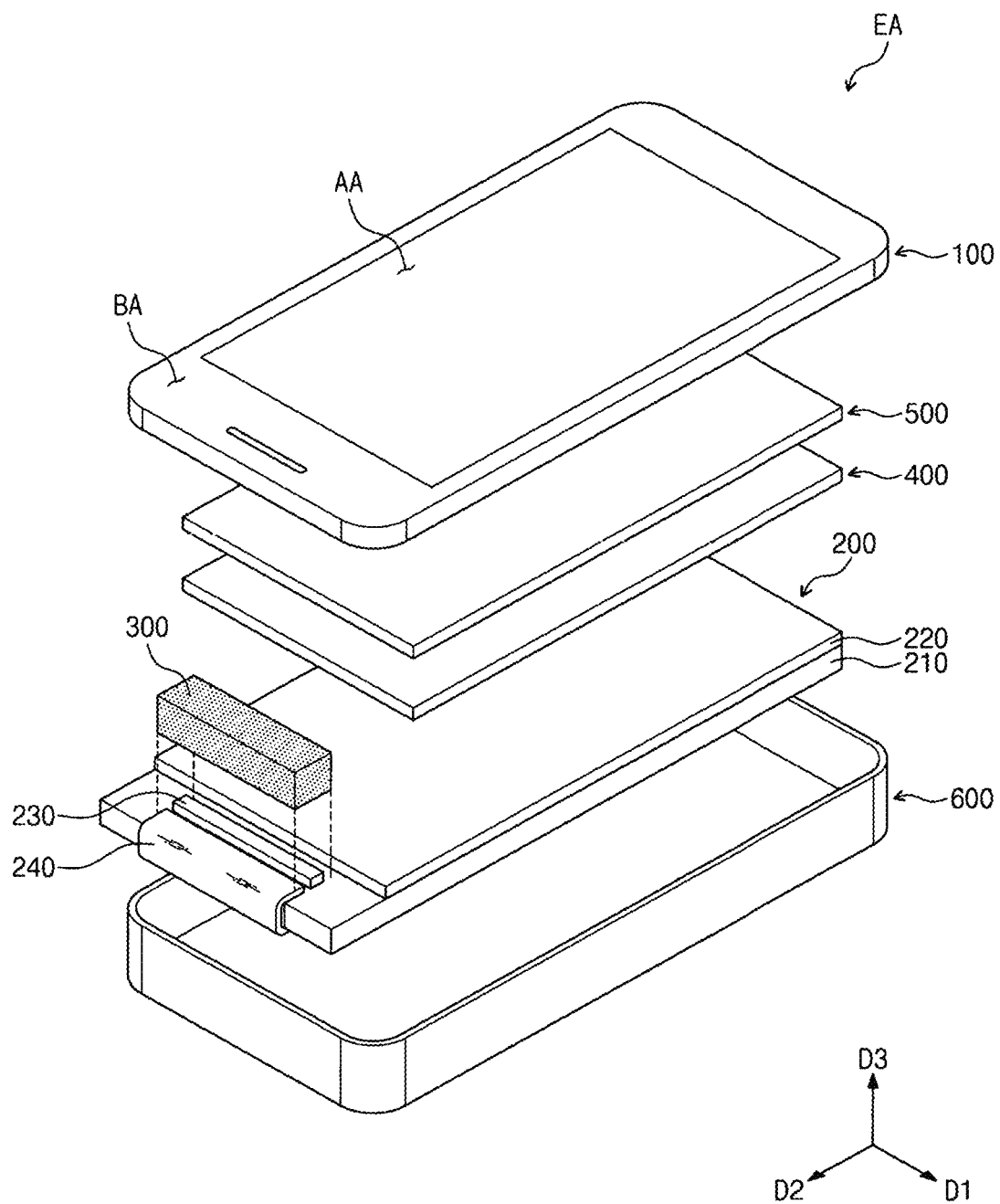
FIG. 1 is an exploded perspective view of a display apparatus according to an embodiment of the inventive concept.
Figure 2:
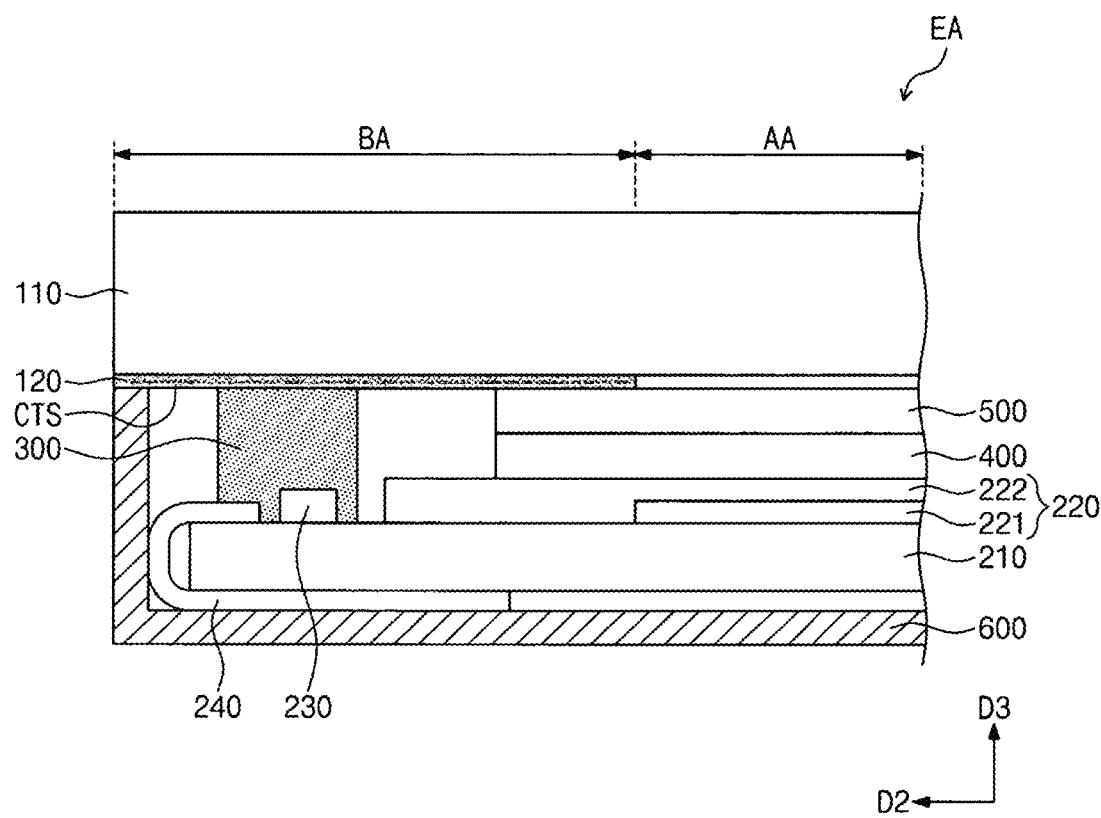
FIG. 2 is a cross-sectional view illustrating a portion of the display apparatus of FIG. 1.

FIG. 1 is an exploded perspective view of a display apparatus according to an embodiment of the inventive concept. FIG. 2 is a cross-sectional view illustrating a portion of the display apparatus of FIG. 1. Hereinafter, a display apparatus EA according to an embodiment of the inventive concept will be described with reference to FIGS. 1 and 2.

The display apparatus EA may include a window member 100, a display member 200, a filling member 300, an optical member 400, an adhesion member 500, and an accommodating member 600.

The window member 100 may be divided into a transmission area AA and a bezel area BA on a plane defined by a first direction D1 and a second direction D2. The transmission area AA may be optically transparent. For example, the transmission area AA may have optical transmittance of about 90% or more. The light generated from the display member 200 is transmitted through the transmission area AA and then may be seen from the outside.

The bezel area BA is adjacent to the transmission area AA. In the current embodiment, the bezel area BA may have a shape that surrounds the transmission area AA. However, the embodiments of FIGS. 1 and 2 are merely illustrated as an example. For example, the bezel area BA according to an embodiment of the inventive concept may have a shape adjacent to only one side of the transmission area AA. The bezel area BA may have various shapes and is not limited to the exemplary embodiment.

The window member 100 includes a transparent part 110 and a bezel part 120. The transparent part 110 may be optically transparent. For example, the transparent part 110 may include glass, plastic, or an insulating film.

The bezel part 120 is disposed in one side of the transparent part 110. The bezel part 120 defines the bezel area BA. The transparent part 110 may be divided into the transmission area AA and the bezel area BA that overlaps with the bezel part 120.

The bezel part 120 may contact the transparent part 110. In the current embodiment, the bezel part 120 may be directly provided to the transparent part 110. For example, the bezel part 120 may be formed on one surface of the transparent part 110, through a printing process or a deposition process.

The display member 200 displays an image. The display member 200 includes a base part 210, a pixel part 220, a first driving circuit 230, and a second driving circuit 240. The base part 210 may include an insulating material. For example, the base part 210 may be any one of a glass substrate, a plastic substrate, a silicon substrate, and an insulating film.

The pixel part 220 may be disposed on the base part 210. The pixel part 220 may include a display layer 221 and an encapsulation layer 222. The display layer 221 includes a plurality of pixels that generate an image. Although not shown, each of the pixels includes at least one thin film transistor and at least one display element.

The display element may include various types of display elements. For example, the display element may include at least any one of an organic light emitting element, an electrophoretic element, a liquid crystal element, and an electrowetting element. In the current embodiment, the pixel part 220 including the organic light emitting element will be described as an example.

The encapsulation layer 222 is disposed on the base part 210 to cover the display layer 221. The encapsulation layer 222 protects the display layer 221. Although not shown, the encapsulation layer 222 may include at least one non-organic film and/or at least one organic film. The encapsulation layer 222 may be a glass substrate and/or stacked thin film encapsulation layers.

The first driving circuit 230 is disposed on the base part 210. The first driving circuit 230 may be electrically connected to the pixel part 220 via a plurality of wires that are not shown. The first driving circuit 230 may provide an electrical signal to the pixel part 220.

The first driving circuit 230 may be directly provided on the base part 210. For example, the first driving circuit 230 and a portion of the pixel part 220 may be formed by the same process, or the first driving circuit 230 may be provided as a type of an interconnect circuit. The first driving circuit 230 may have various embodiments and is not limited to the exemplary embodiment.

The second driving circuit 240 is partially disposed on the base part 210 and connected to the pixel part 220. The second driving circuit 240 may be a circuit board including a driving element and a wire. One side of the second driving circuit 240 may be bent and disposed in a bottom side of the base part 210. Accordingly, the second driving circuit 240 may be stably accommodated within a space provided by the accommodating member 600, which will be described later.

Although not shown, the second driving circuit 240 may contact a plurality of pads disposed on the base part 210 and overlapping the bezel part 120. The second driving circuit 240 may be electrically connected to the pixel part 220 through the pads. The second driving circuit 240 provides an electrical signal to the pixel part 220.

The filling member 300 is disposed between the window member 100 and the base part 210. The filling member 300 fills a gap between the base part 210 and the window member 100. The window member 100 may be supported by the filling member 300.

The filling member 300 includes an insulating material. For example, the filling member 300 may include a thermoplastic material or a photo-curable material.

The filling member 300 is disposed in the bezel area BA. The filling member 300 may be disposed to overlap the pads. The filling member 300 may partially or entirely cover the first driving circuit 230. The second driving circuit 240 may be partially covered by the filling member 300.

The filling member 300 may contact the bezel part 120. In the bezel part 120, a contact surface CTS contacting the filling member 300 may have an adhesion property. Accordingly, the filling member 300 may be easily attached to the bezel part 120, even though a separate adhesion layer is not provided.

Alternatively, the adhesion property may be omitted in the contact surface CTS. In this case, the filling member 300 and the bezel part 120 may be easily coupled to each other, by a separate adhesion layer disposed between the bezel part 120 and the filling member 300 or with assistance of the adhesion property included in the filling member 300.

The optical member 400 may be disposed between the window member 100 and the display member 200. The optical member 400 is disposed to overlap the transmission area AA. The optical member 400 may enhance luminance of an image produced by the display member 200 or may reduce or eliminate reflection of external light, thereby improving the visibility. For example, the optical member 400 may include at least one of a light polarizing film, a light compensating film, and a color filter. Alternatively, in the display apparatus EA according to an embodiment of the inventive concept, the optical member 400 may be omitted.

The adhesion member 500 is disposed between the optical member 400 and the window member 100. The adhesion member 500 couples the optical member 400 and the window member 100. The adhesion member 500 may be disposed to overlap the transmission area AA.

Accordingly, the adhesion member 500 may include a clear adhesive material. For example, the adhesion member 500 may include at least any one of an optical clear adhesive (OCA), an optical clear resin (OCR), and a pressure sensitive adhesive (PSA). Alternatively, in the display apparatus EA according to an embodiment of the inventive concept, the adhesion member 500 may be omitted.

The accommodating member 600 defines a predetermined internal space. The display member 200, the optical member 400, and the adhesion member 500 may be accommodated in the internal space.

The accommodating member 600 may be coupled to the window member 100. The accommodating member 600 and the window member 100 may define an outer member of the display apparatus EA.

The display apparatus EA according to an embodiment of the inventive concept includes the bezel part 120 having the contact surface CTS with adhesion property and the filling member 300 attached to the contact surface CTS, to thereby support a gap created between the window member 100 and the display member 200. Accordingly, the window member 100 may be stably supported preventing the window member 100 from being damaged due to an external impact.

Figure 3:
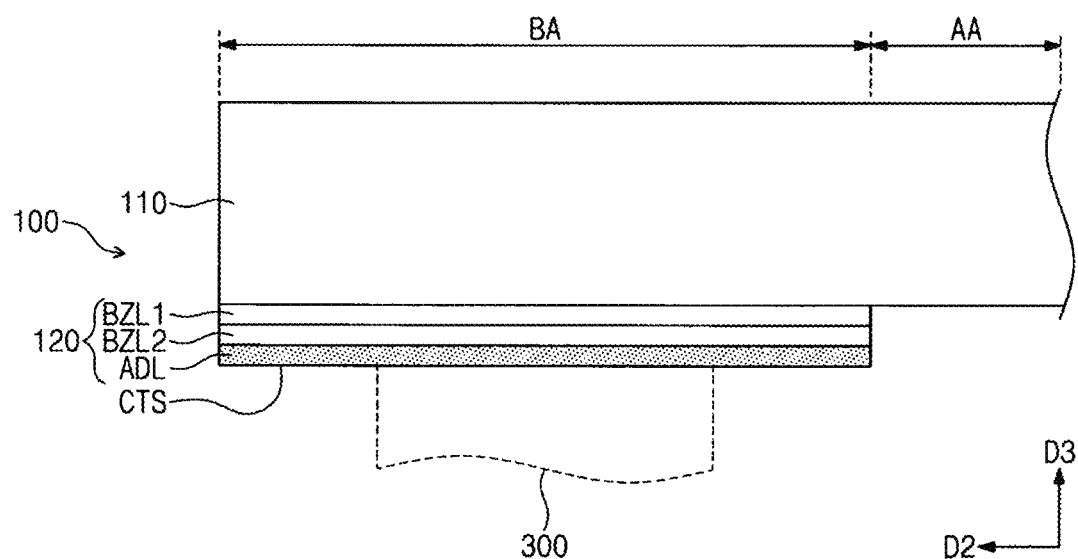
FIG. 3 is a cross-sectional view illustrating a portion of a window member according to an embodiment of the inventive concept.

FIG. 3 is a cross-sectional view illustrating a portion of the window member according to an embodiment of the inventive concept. FIG. 3 is an enlarged view of a region of the window member 100 of FIG. 2. Hereinafter, a window member 100 will be described with reference to FIG. 3. Here, the same reference numeral may be given to components that are the same as those of FIGS. 1 and 2, and their duplicated descriptions will be omitted.

As illustrated in FIG. 3, a bezel part 120 may include a plurality of layers. For example, the bezel part 120 may include a first layer BZL1, a second layer BZL2, and an adhesion layer ADL.

The first layer BZL1 may be a color layer. The first layer BZL1 has a predetermined color. A bezel area BA of the window member 100 may have a color determined by the first layer BZL1.

The second layer BZL2 may be a shielding layer. The second layer BZL2 may provide a shielding function so that components disposed under the bezel part 120 are not visually projected to the bezel area BA. The color of the first layer BZL1 may be seen as the color of the bezel area BA by the second layer BZL2. Alternatively, according to an embodiment of the inventive concept, any one of the first layer BZL1 and the second layer BZL2 may be omitted.

The adhesion layer ADL may be laminated on the first layer BZL1 or the second layer BZL2. The adhesion layer ADL includes an adhesive material. For example, the adhesion layer ADL may include a thermoplastic material or a photo-curable material.

In the current embodiment, a contact surface CTS may be defined on one surface of the adhesion layer ADL. In FIG. 3, for ease of description, a filling member 300 is illustrated by a dotted line. As illustrated in FIG. 3, the contact surface CTS contacting the filling member 300 is defined on the adhesion layer ADL, thereby enabling stable coupling with the filling member 300.

Figure 4:
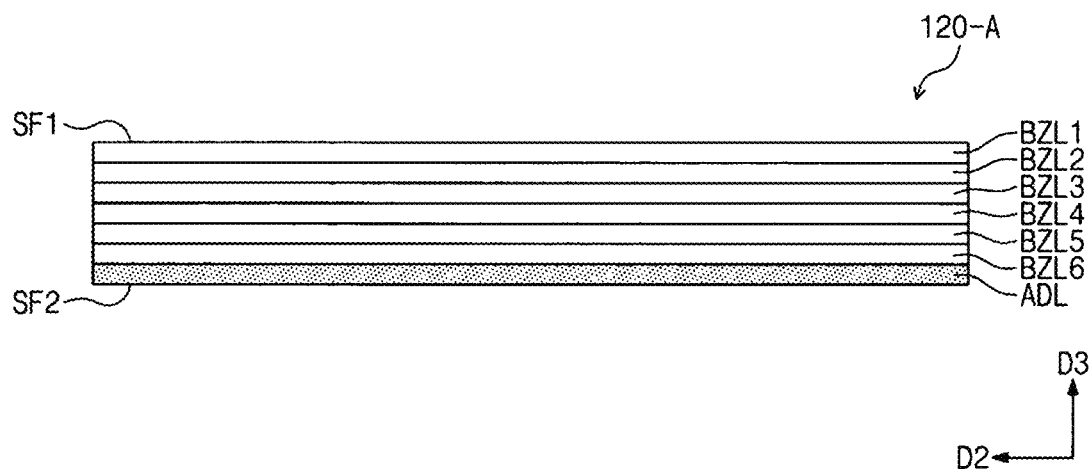
FIG. 4 is a cross-sectional view illustrating a partial configuration of a window member according to an embodiment of the inventive concept.

FIG. 4 is a cross-sectional view illustrating a partial configuration of a window member according to an embodiment of the inventive concept. FIG. 4 illustrates a bezel part 120-A according to an embodiment of the inventive concept. Hereinafter, the same reference numeral may be given to components that are the same as those of FIGS. 1 to 3, and their duplicated descriptions will be omitted.

As illustrated in FIG. 4, the bezel part 120-A may include a first layer BZL1, a second layer BZL2, a third layer BZL3, a fourth layer BZL4, a fifth layer BZL5, a sixth layer BZL6, and an adhesion layer ADL. The first to sixth layers BZL1, BZL2, BZL3, BZL4, BZL5, and BZL6 may be successively formed on the transparent part 110 (see FIG. 3). For example, the first to sixth layers BZL1, BZL2, BZL3, BZL4, BZL5, and BZL6 may be successively formed by a printing process or a deposition process.

The adhesion layer ADL is laminated on the stacked layer of the first to sixth layers BZL1, BZL2, BZL3, BZL4, BZL5, and BZL6. The adhesion layer ADL may include an adhesive material. In the current embodiment, the adhesion layer ADL may correspond to the adhesion layer ADL of FIG. 3. Thus, the duplicated descriptions thereof will be omitted.

The first layer BZL1, the second layer BZL2, the third layer BZL3, the fourth layer BZL4, the fifth layer BZL5, and the sixth layer BZL6 may determine the color of the bezel area BA. The first to sixth layers BZL1, BZL2, BZL3, BZL4, BZL5, and BZL6 may be layers having various functions.

For example, the first layer BZL1 may be a logo pattern layer. Accordingly, the bezel part 120-A may realize the bezel area BA that displays a predetermined logo. The second layer BZL2 may be a background layer. The second layer BZL2 may determine the background color of the bezel area BA defined by the bezel part 120-A.

The third layer BZL3 and the fourth layer BZL4 may be shielding layers. The third layer BZL3 and the fourth layer BZL4 may visually shield components disposed under the bezel part 120-A.

The fifth layer BZL5 and the sixth layer BZL6 may be additional pattern layers. For example, the fifth layer BZL5 and the sixth layer BZL6 may be icon pattern layers that determine colors of icons that may be disposed in the bezel area BA. In this case, the shielding layers may further have opening patterns that correspond to the icons.

However, the embodiment of FIG. 4 is merely illustrated as an example. Any one of the first to sixth layers BZL1, BZL2, BZL3, BZL4, BZL5, and BZL6 may be omitted, or some of them may be substituted for each other. The first to sixth layers BZL1, BZL2, BZL3, BZL4, BZL5, and BZL6 may include various embodiments, and are not limited to the exemplary embodiment.

The bezel part 120-A according to an embodiment of the inventive concept may include various layers. The bezel part 120-A may produce various colors of the bezel area through the various layers.

According to the present disclosure, the bezel part 120-A may include a top surface SF1 and a bottom surface SF2. The top surface SF1 may be a surface that contacts a transparent part 110. The top surface SF1 may be closely attached to the transparent part 110 without a separate adhesion layer.

The bottom surface SF2 may be a surface that contacts the filling member 300 (see FIG. 3). The bottom surface SF2 is a surface on which the contact surface CTS (see FIG. 3) is defined. In the current embodiment, the contact surface CTS may substantially have an adhesion property of the adhesion layer ADL.

Figure 5:
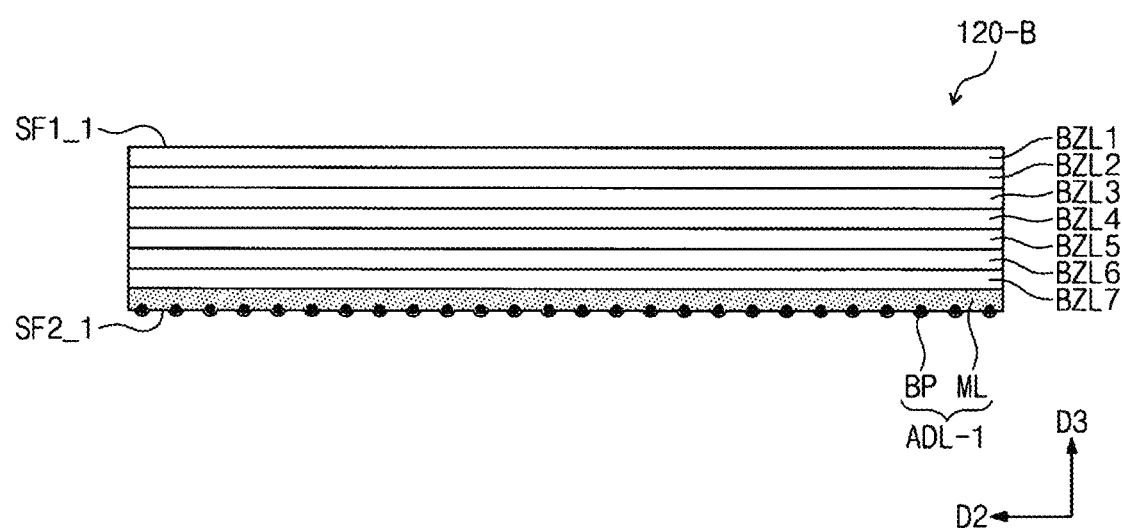
FIG. 5 is a cross-sectional view illustrating a partial configuration of a window member according to another embodiment of the inventive concept.

FIG. 5 is a cross-sectional view illustrating a partial configuration of a window member according to another embodiment of the inventive concept. FIG. 5 illustrates a bezel part 120-B according to an embodiment of the inventive concept. Hereinafter, the bezel part 120-B will be described with reference to FIG. 5.

As illustrated in FIG. 5, the bezel part 120-B may include first to seventh layers BZL1, BZL2, BZL3, BZL4, BZL5, BZL6, and BZL7, and an adhesion layer ADL-1. The first to seventh layers BZL1, BZL2, BZL3, BZL4, BZL5, BZL6, and BZL7 may include various functional layers. For example, the first to seventh layers BZL1, BZL2, BZL3, BZL4, BZL5, BZL6, and BZL7 may include at least one of a logo pattern layer, a background layer, a shielding layer, and an icon pattern layer that are described above.

The adhesion layer ADL-1 may include a medium portion ML and a plurality of particles BP. The medium portion ML is disposed on the seventh layer BZL7. The medium portion ML may include an organic material. The medium portion ML allows the plurality of particles BP to be stably fixed in a dispersed pattern.

In addition, the medium portion ML may include an adhesive material. For example, the medium portion ML may include at least any one of an optical clear adhesive (OCA), an optical clear resin (OCR), and a pressure sensitive adhesive (PSA).

The particles BP may be dispersed in the medium portion ML. The particles BP include beads. The particles BP may control roughness of the contact surface CTS (see FIG. 3) of the adhesion layer ADL-1. The contact surface CTS may be an indented surface having a plurality of uneven portions created by the particles BP. Accordingly, the uneven portions may increase a surface area of the contact surface CTS.

According to the present disclosure, the bezel part 120-B may include a top surface SF1_1 and a bottom surface SF2_1. The bottom surface SF2_1 may be a surface that contacts the filling member 300 (see FIG. 3) and the accommodating member 600 (see FIG. 1).

The bezel part 120-B according to an embodiment of the inventive concept may enhance an adhesion property of the contact surface CTS, by increasing a surface area of the bottom surface SF2_1. Accordingly, coupling forces between the window member 100 (see FIG. 1) and the accommodating member 600 (see FIG. 1), and between the window member 100 (see FIG. 1) and the filling member 300 (see FIG. 3) may be increased, and the internal components of the display apparatus EA may be stably protected against external contamination.

Figure 6A:
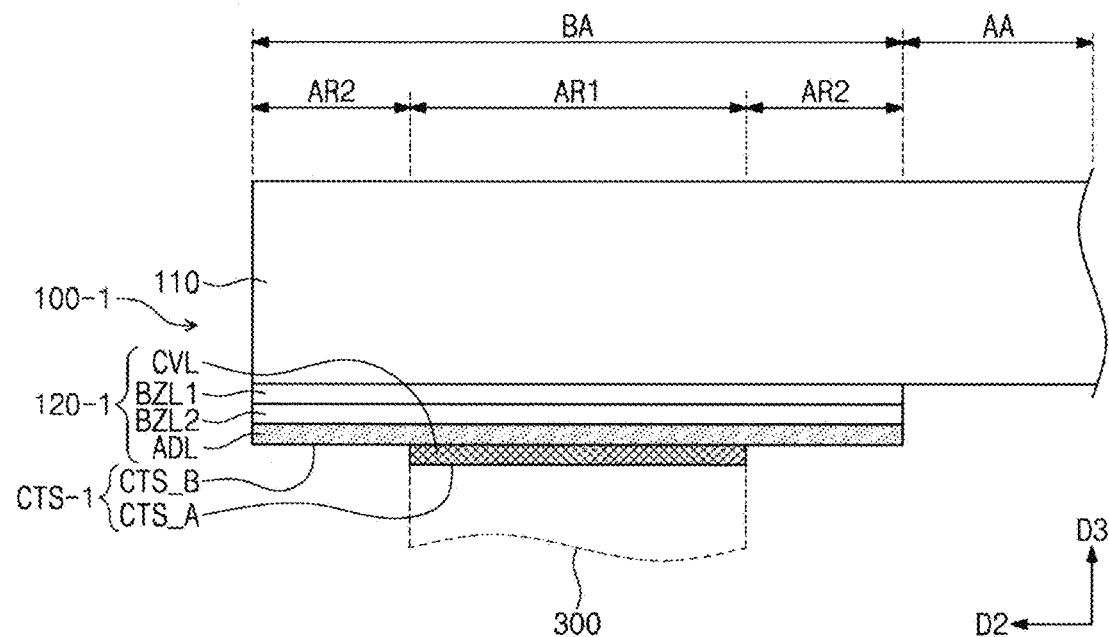
FIG. 6A is a cross-sectional view illustrating a portion of a window member according to an embodiment of the inventive concept.
Figure 6B:
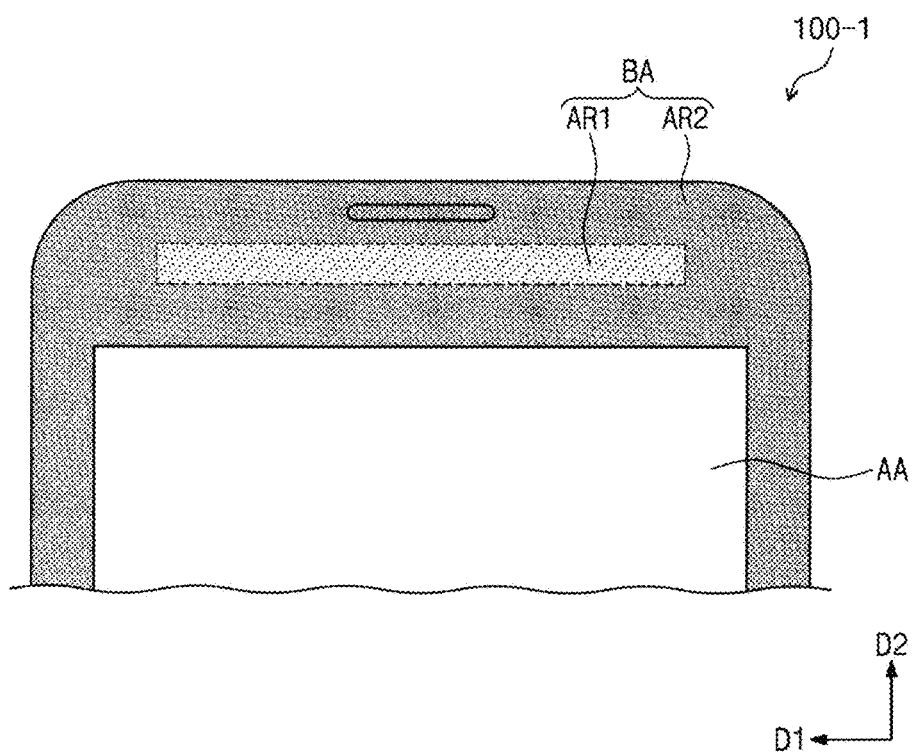
FIG. 6B is a plan view illustrating a portion of a window member according to an embodiment of the inventive concept.

FIG. 6A is a cross-sectional view illustrating a portion of a window member according to an embodiment of the inventive concept. FIG. 6B is a plan view illustrating a portion of a window member according to an embodiment of the inventive concept.

Referring to FIGS. 6A and 6B, a window member 100-1 according to an embodiment of the inventive concept will be described. Here, the same reference numeral may be given to components that are the same as those of FIGS. 1 to 5, and their duplicated descriptions will be omitted.

As illustrated in FIG. 6A, a bezel area BA may include a first area AR1 and a second area AR2. A contact surface CTS-1 may have different adhesion properties between the first area AR1 and the second area AR2.

On the contact surface CTS-1, a first portion CTS_A corresponding to the first area AR1 may have an adhesion property less than that of a second portion CTS_B corresponding to the second area AR2.

In the current embodiment, a bezel part 120-1 may further include a cover layer CVL. The cover layer CVL may have an insulating material. The cover layer CVL partially covers an adhesion layer ADL. The window member 100-1 further includes the cover layer CVL, and thus may be divided into the first area AR1 and the second area AR2.

The contact surface CTS-1 of the bezel part 120-1 may be defined by two layers or more. For example, the first portion CTS_A and the second portion CTS_B may be defined on different layers. In the current embodiment, the first portion CTS_A of the contact surface CTS-1 may correspond to the cover layer CVL, and the second portion CTS_B of the contact surface CTS-1 may correspond to a portion of the adhesion layer ADL that is not covered by the cover layer CVL.

The first portion CTS_A of the contact surface CTS-1 may have an adhesion property corresponding to that of the cover layer CVL, and the second portion CTS_B of the contact surface CTS-1 may have an adhesion property corresponding to that of the adhesion layer ADL. Therefore, the adhesion property of the second portion CTS_B including the adhesion layer ADL may be greater than that of the first portion CTS_A including the cover layer CVL.

In the current embodiment, the first area AR1 may be defined in a region of the bezel area BA overlapping a filling member 300. Therefore, the region of the bezel area BA overlapping the filling member 300 may be defined as the first area AR1.

The window member 100-1 according to an embodiment of the inventive concept further include the cover layer CVL, and thus two areas AR1 and AR2 having different adhesion properties may be provided in the bezel area BA. Accordingly, rework characteristic of the filling member 300 may be enhanced by partially lowering the adhesion property of only a region that contacts the filling member 300. In addition, a coupling force with the accommodating member 600 (see FIG. 1) may be enhanced by imparting the adhesion property to a region that does not overlap the filling member 300. Accordingly, it is possible to prevent the display member 200 (see FIG. 1) from being damaged by external moisture or contamination.

Figure 7:
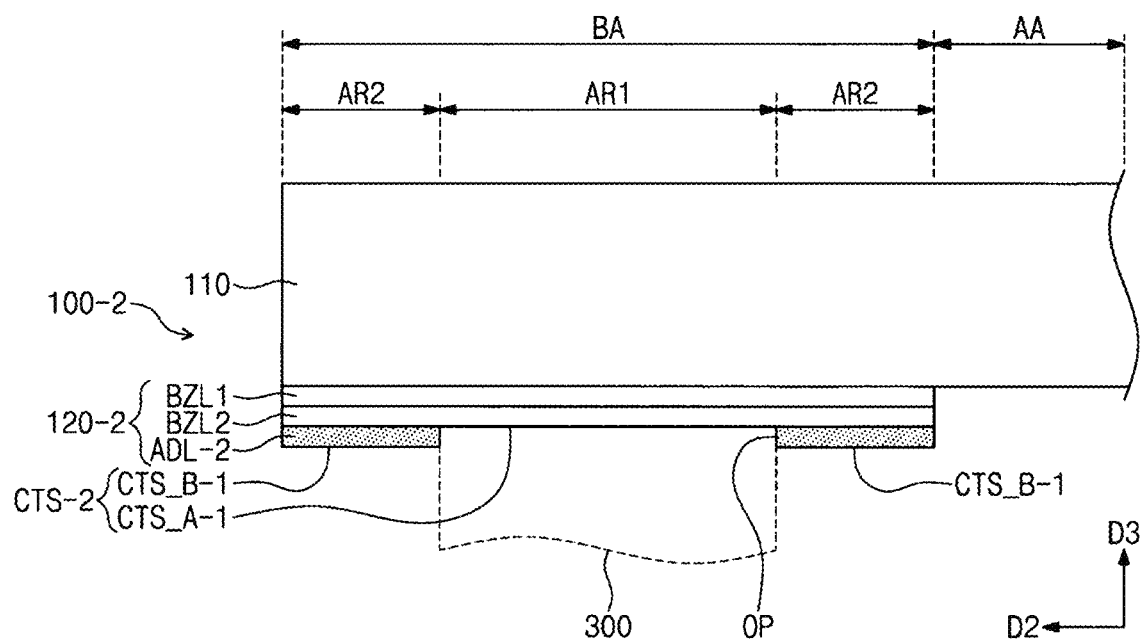
FIG. 7 is a cross-sectional view illustrating a portion of a window member according to an embodiment of the inventive concept.

FIG. 7 is a cross-sectional view illustrating a portion of a window member according to an embodiment of the inventive concept. In FIG. 7, for ease of description, a filling member 300 is illustrated by a dotted line.

Hereinafter, a window member 100-2 according to an embodiment of the inventive concept will be described with reference to FIG. 7. Here, the same reference numeral may be given to components that are the same as those of FIGS. 1 to 6B, and their duplicated descriptions will be omitted.

As illustrated in FIG. 7, the window member 100-2 may include a bezel part 120-2 having an adhesion layer ADL-2 that is different from the adhesion layer ADL of FIG. 6A. The adhesion layer ADL-2 may partially cover a second layer BZL2. For example, a predetermined opening OP may be defined in the adhesion layer ADL-2 to expose a portion of the second layer BZL2.

The opening OP may have a shape corresponding to that of the filling member 300 on a plane. The filling member 300 may contact the second layer BZL2 through the opening OP.

The window member 100-2 according to an embodiment of the inventive concept includes the adhesion layer ADL-2 that partially cover the second layer BZL2, and thus may provide a contact surface CTS-2 including a first portion CTS_A-1 and a second portion CTS_B-1 that have different adhesion properties. The first portion CTS_A-1 and the second portion CTS_B-1 may be respectively defined on different layers, and thus may have different adhesion properties.

According to an embodiment of the inventive concept, attachment and detachment between the window member 100-2 and the filling member 300 may be facilitated by relatively lowering an adhesion property on a surface of the contact surface CTS-2 that contacts the filling member 300. Accordingly, the window member 100-2 may be easily separated and then reused, even after being assembled with the display member 200 (see FIG. 1) and the filling member 300. Thus, rework characteristic of the window member 100-2 is enhanced, and thus process reliability of the display apparatus EA may be enhanced, and process costs may be reduced.

Figure 8A:
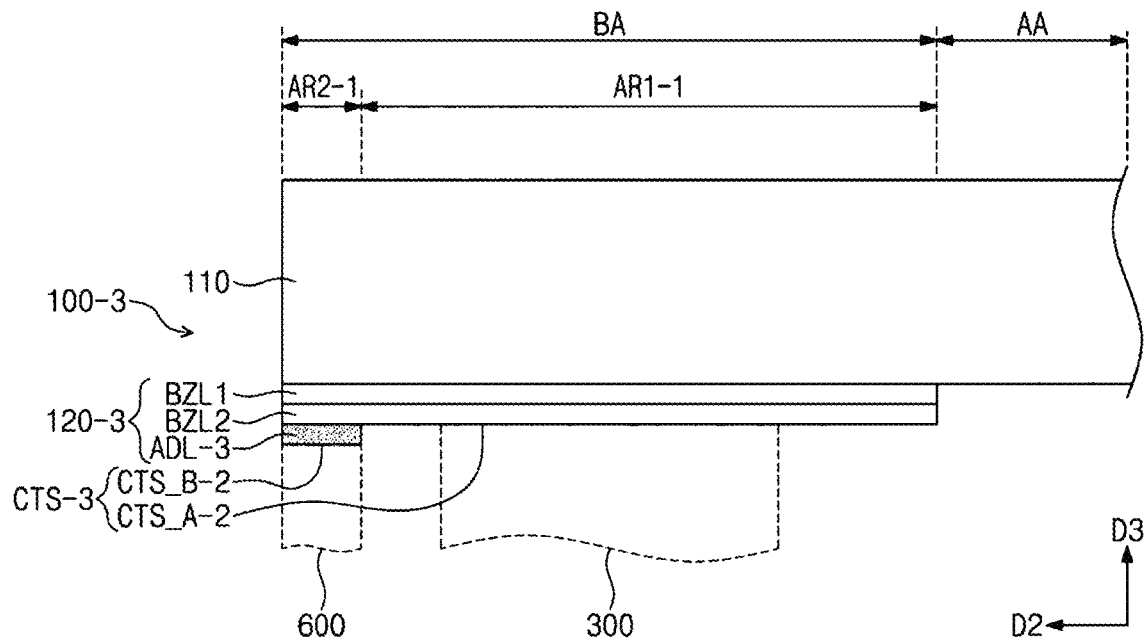
FIG. 8A is a cross-sectional view illustrating a portion of a window member according to an embodiment of the inventive concept.
Figure 8B:
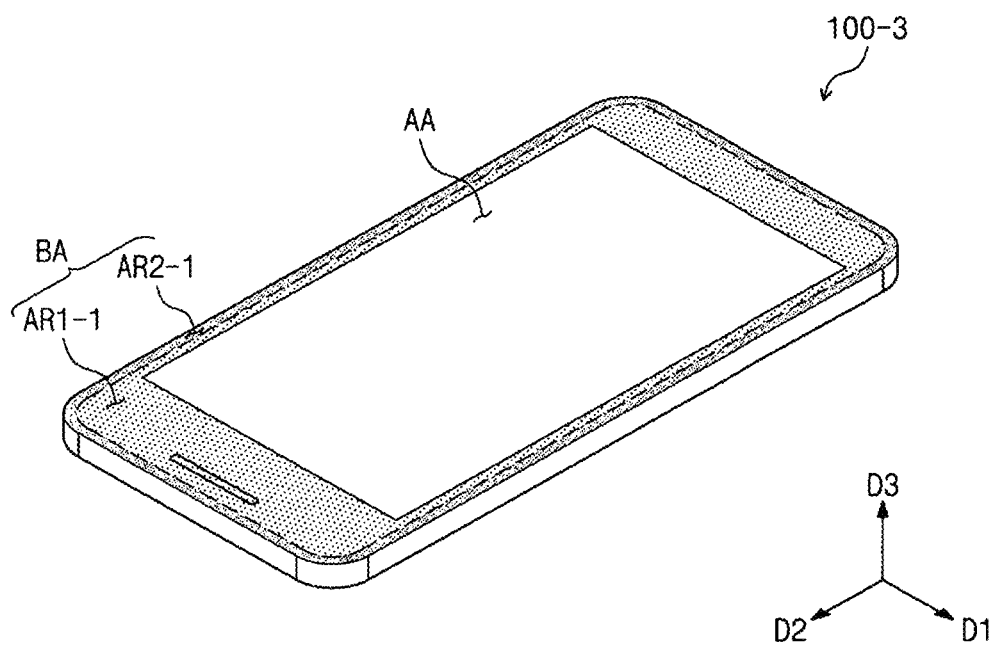
FIG. 8B is a perspective view of the window member of FIG. 8A.

FIG. 8A is a cross-sectional view illustrating a portion of a window member according to an embodiment of the inventive concept. FIG. 8B is a perspective view of the window member of FIG. 8A. In FIG. 8A, for ease of description, portions of a filling member 300 and an accommodating member 600 are illustrated by dotted lines. In FIG. 8B, a first area AR1-1 and a second area AR2-1 are illustrated with different shades to be easily distinguishable. However, this is intended to distinguish between the areas, so that the first area AR1-1 and the second area AR2-1 may be seen identically.

Hereinafter, a window member 100-3 according to an embodiment of the inventive concept will be described with reference to FIGS. 8A and 8B. Here, the same reference numeral may be given to components that are the same as those of FIGS. 1 to 7, and their duplicated descriptions will be omitted.

As illustrated in FIGS. 8A and 8B, a bezel area BA of the window member 100-3 includes the first area AR1-1 and the second area AR2-1 that have different adhesion properties. The first area AR1-1 and the second area AR2-1 may be defined by an adhesion layer ADL-3 of a bezel part 120-3.

The adhesion layer ADL-3 may partially cover a second layer BZL2. In the current embodiment, the adhesion layer ADL-3 may have a frame shape extending along an edge of the second layer BZL-2. Accordingly, the second area AR2-1 may be provided as a frame shape surrounding the first area AR1-1.

The adhesion layer ADL-3 and the second layer BZL-2 may provide a contact surface CTS-3. A region of the second layer BZL2 that is exposed by the adhesion layer ADL-3 defines a first portion CTS_A-2 of the contact surface CTS-3, and the adhesion layer ADL-3 defines a second portion CTS_B-2 of the contact surface CTS-3. Accordingly, the first area AR1-1 and the second area AR2-1 may be provided in different layers, and thus may have different adhesion properties.

The filling member 300 is disposed in the first area AR1-1. According to an embodiment of the inventive concept, the first area AR1-1 may have an area greater than or equal to that of the filling member 300 on a plane.

The accommodating member 600 may be disposed in the second area AR2-1. In the current embodiment, the accommodating member 600 may be coupled to the window member 100-3 through the adhesion layer ADL-3 of the bezel part 120-3. The accommodating member 600 may be coupled to the second portion CTS_B-2 having a relatively higher adhesion property, and thus may provide the stable coupling with the window member 100-3, and may stably protect components accommodated in the accommodating member 600 against external impact or external contamination.

The window member 100-3 according to an embodiment of the inventive concept includes the bezel part 120-3 that provides the first area AR1-1 and the second area AR2-1 of the frame shape, and thus rework characteristic may be enhanced, and sealing performance of the display apparatus may be improved simultaneously. Accordingly, it may be possible to provide the display apparatus in which reliability in the attachment/detachment process and reliability in use are improved simultaneously.

Figure 9:
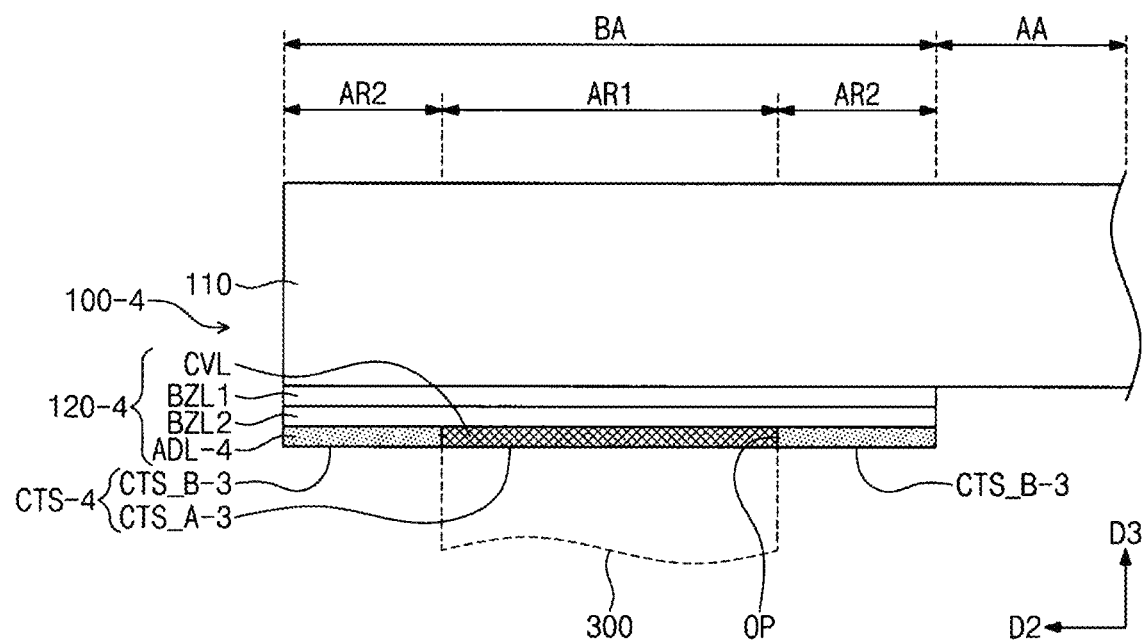
FIG. 9 is a cross-sectional view illustrating a portion of a window member according to an embodiment of the inventive concept.

FIG. 9 is a cross-sectional view illustrating a portion of a window member according to an embodiment of the inventive concept. In FIG. 9, for ease of description, a filling member 300 is illustrated by a dotted line.

Hereinafter, a window member 100-4 according to an embodiment of the inventive concept will be described with reference to FIG. 9. Here, the same reference numeral may be given to components that are the same as those of FIGS. 1 to 8B, and their duplicated descriptions will be omitted.

As illustrated in FIG. 9, the window member 100-4 may include a bezel part 120-4 that further includes a cover layer CVL. The bezel part 120-4 may include an adhesion layer ADL-4 in which a predetermined opening OP is defined. The adhesion layer ADL-4 may substantially correspond to the adhesion layer ADL-2 of FIG. 7. Accordingly, the duplicated descriptions thereof will be omitted.

The cover layer CVL may be disposed in the opening OP defined in the adhesion layer ADL-4. The cover layer CVL covers a portion of a second layer BZL2 exposed through the opening OP.

Accordingly, a contact surface CTS-4 provided by the bezel part 120-4 may be defined by the adhesion layer ADL-4 and the cover layer CVL. Particularly, a first portion CTS_A-3 may be defined by the cover layer CVL, and a second portion CTS_B-3 may be defined by the adhesion layer ADL-4. The first portion CTS_A-3 provides a first area AR1 having a relatively lower adhesion property, and the second portion CTS_B-3 provides a second area AR2 having a relatively higher adhesion property.

The window member 100-4 according to an embodiment of the inventive concept further include the cover layer CVL, and thus may provide a contact surface having an adhesion property different from that of the adhesion layer ADL-4. The cover layer CVL provides the first area AR1 that has an adhesion property relatively lower than that of the second area AR2 on the contact surface CTS-4.

According to an embodiment of the inventive concept, attachment and detachment between the window member 100-4 and the filling member 300 may be facilitated by relatively lowering an adhesion property on a surface of the contact surface CTS-4 that contacts the filling member 300. Accordingly, the window member 100-4 may be easily separated and then reused, even after being assembled with the display member 200 (see FIG. 1) and the filling member 300. Thus, rework characteristic of the window member 100-4 is enhanced, and thus process reliability of the display apparatus may be enhanced, and process costs may be reduced.

Figure 10A:
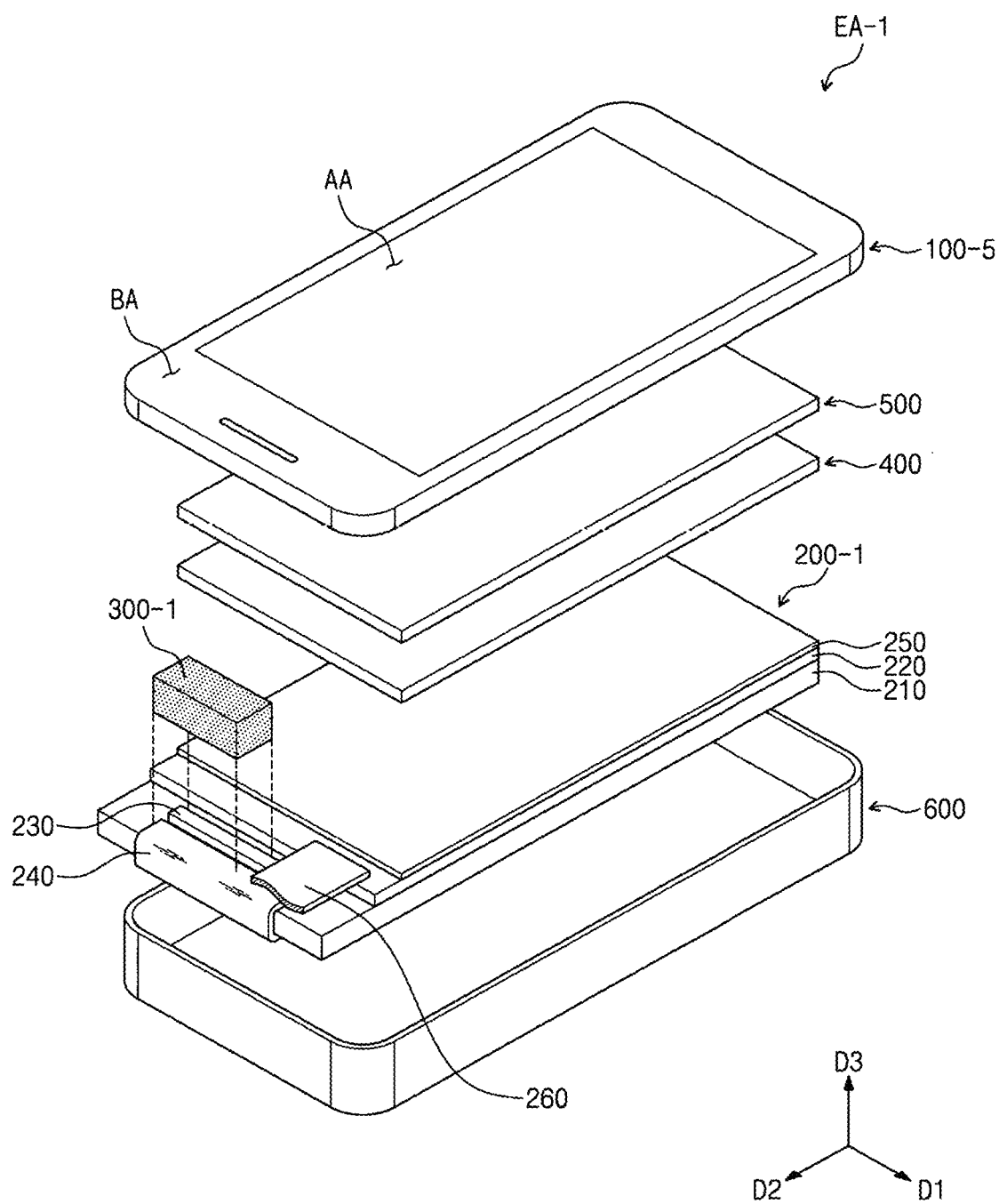
FIG. 10A is an exploded perspective view of a display apparatus according to an embodiment of the inventive concept.
Figure 10B:
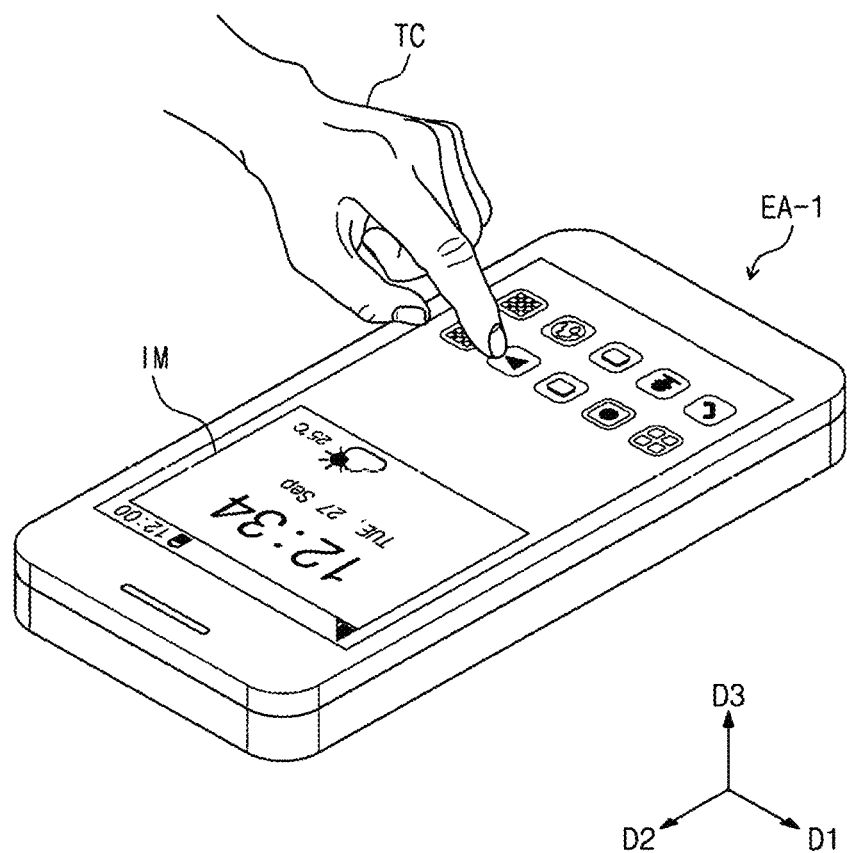
FIG. 10B is a perspective view of the assembled display apparatus of FIG. 10A.
Figure 11:
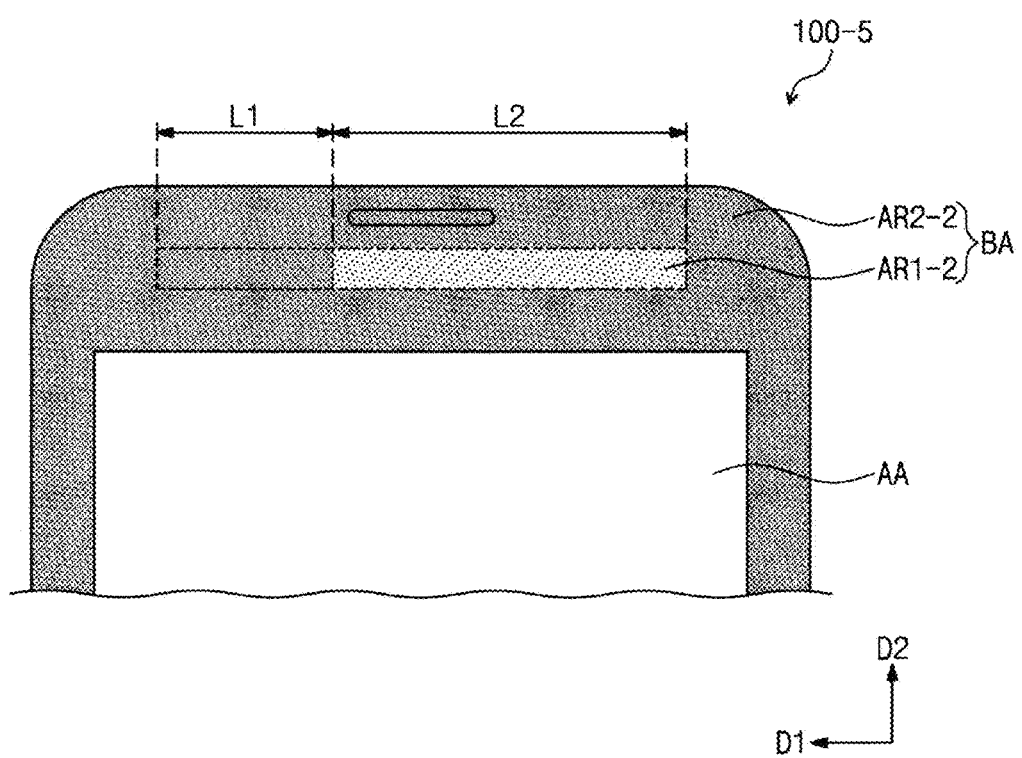
FIG. 11 is a partial plan view of the configuration illustrated in FIG. 10A.

FIG. 10A is an exploded perspective view of a display apparatus according to an embodiment of the inventive concept. FIG. 10B is a perspective view of the assembled display apparatus of FIG. 10A. FIG. 11 is a partial plan view of the configuration illustrated in FIG. 10A. In FIG. 11, a window member 100-5 is partially illustrated, and areas are illustrated with shades for ease of distinction and description.

Hereinafter, a display apparatus EA-1 according to an embodiment of the inventive concept will be described with reference to FIGS. 10A, 10B, and 11. Here, the same reference numeral may be given to components that are the same as those of FIGS. 1 to 9, and their duplicated descriptions will be omitted.

The display apparatus EA-1 may include the window member 100-5, a display member 200-1, a filling member 300-1, an optical member 400, an adhesion member 500, and an accommodating member 600. The optical member 400, the adhesion member 500, and the accommodating member 600 may respectively correspond to the components of the display apparatus EA of FIG. 1. Thus, the duplicated descriptions thereof will be omitted.

Referring to FIGS. 10A and 10B, the display member 200-1 may display an image IM and detect a touch TC that is externally applied. The image IM may be seen from the outside through a transmission area AA.

The touch TC may include various types of external inputs. For example, the touch TC includes various types of external inputs such as a portion of user's body, light, heat, pressure, or the like. In addition, the display apparatus EA-1 may detect a touch input to the window member 100-5, and may also detect an input that is approaching or adjacent to the window member 100-5. The display apparatus EA-1 according to an embodiment of the inventive concept may detect various types of inputs and is not limited to the exemplary embodiment.

The display member 200-1 includes a base part 210, a pixel part 220, a first driving circuit 230, and a second driving circuit 240, a detection layer 250, and a detection driving circuit 260. The base part 210, the pixel part 220, the first driving circuit 230, and the second driving circuit 240 may correspond to the components of FIG. 1. Thus, the duplicated descriptions thereof will be omitted.

The detection layer 250 may be disposed on the pixel part 220. The detection layer 250 may include a sensor for detecting the touch TC and disposed on and overlapping the pixel. The detection layer 250 may include various types of sensors depending on a detecting method. The detection layer 250 may detect capacity variation caused by the touch TC or resistance variation caused by the touch TC, and a position or intensity of the touch TC may be detected.

The detection driving circuit 260 may be disposed in one side of the pixel part 220. The detection driving circuit 260 is electrically connected to the detection layer 250, and thus may provide an electrical signal to the detection layer 250 or receive an electrical signal from the detection layer 250.

The filling member 300-1 may be disposed to be adjacent to the detection driving circuit 260. The filling member 300-1 may be disposed not to overlap the detection driving circuit 260.

Referring to FIG. 11, the window member 100-5 may be divided into a bezel area BA and a transmission area AA on a plane. The bezel area BA may include a first area AR1-2 and a second area AR2-2 that have different adhesion properties.

In the current embodiment, the first area AR1-2 and the second area AR2-2 may be divided to correspond to a shape of the filling member 300-1. Particularly, the first area AR1-2 with a relatively lower adhesion property has a predetermined width L2 in a first direction D1. The width L2 of the first area AR1-2 in the first direction D1 may be a length corresponding to a width of the filling member 300-1 in the first direction D1.

The width L2 of the first area AR1-2 in the first direction D1 may have a size reduced by a length L1 when compared to a width of the filling member 300 (see FIG. 1) of FIG. 1 in the same direction. The reduced length L1 may be substantially a length corresponding to a width of the detection driving circuit 260 in the first direction D1.

The display apparatus EA-1 according to an embodiment of the inventive concept may prevent physical interference between the driving circuits (e.g., the first driving circuit 230, the second driving circuit 240, and the detection driving circuit 260) and the filling member 300-1 by suitably designing a size of the filling member 300-1 and placing the filling member 300-1 around the driving circuits of the display member 200-1. In addition, the display apparatus according to an embodiment of the inventive concept has the first area AR1-2 that is provided only in an area corresponding to the filling member 300-1, and thus rework characteristic and product reliability may be simultaneously enhanced.

Figure 12A:
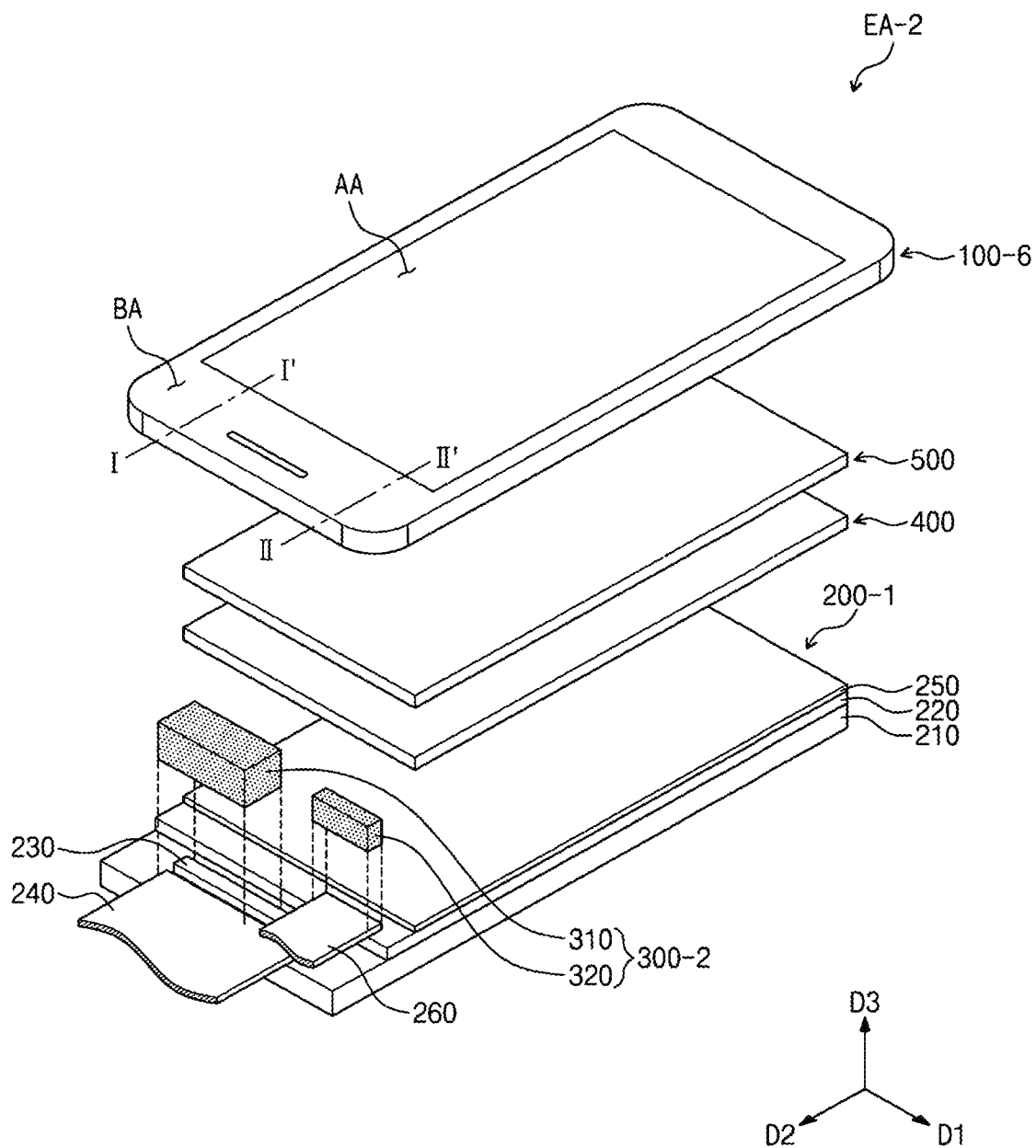
FIG. 12A is an exploded perspective view of a display apparatus according to an embodiment of the inventive concept.
Figure 12B:
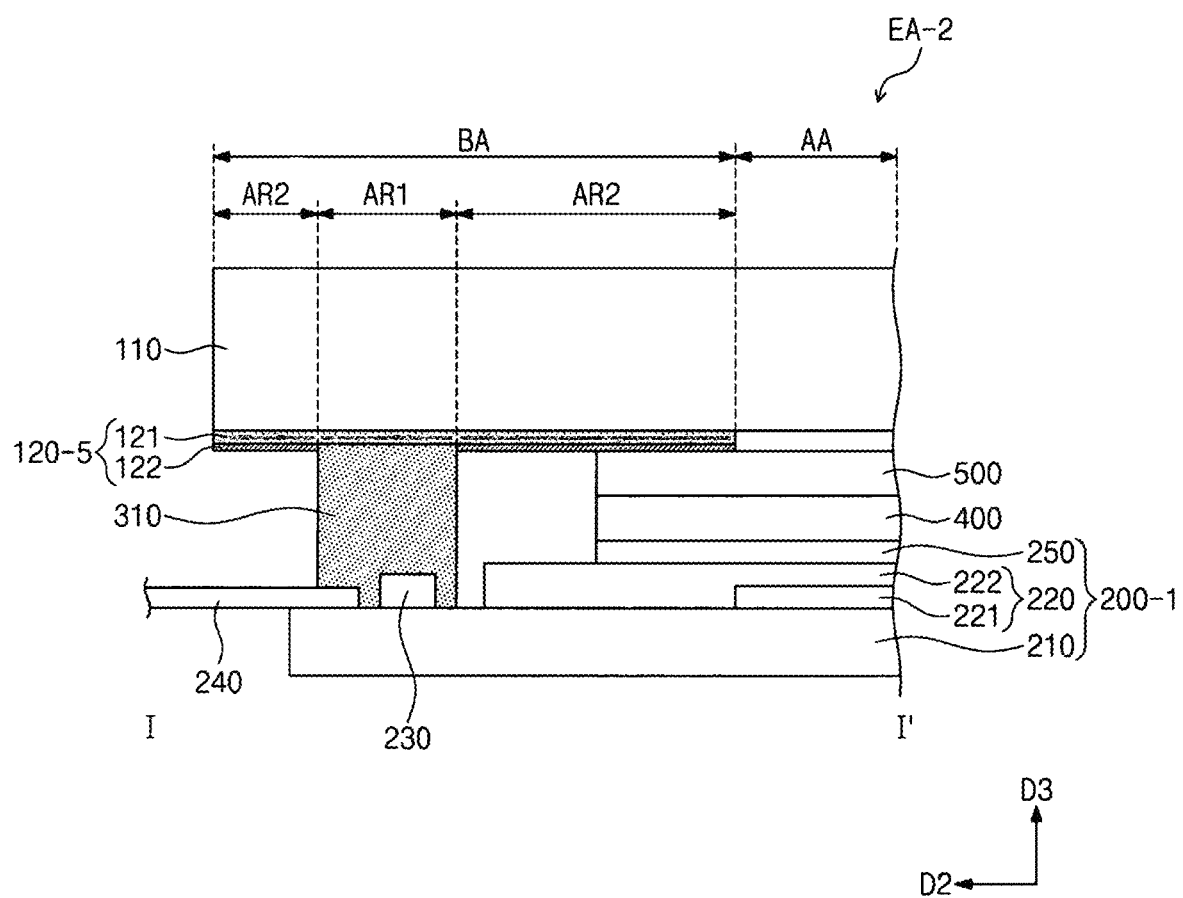
FIGS. 12B and 12C are cross-sectional views partially illustrating a state in which the display apparatus of FIG. 12A is assembled.
Figure 12C:
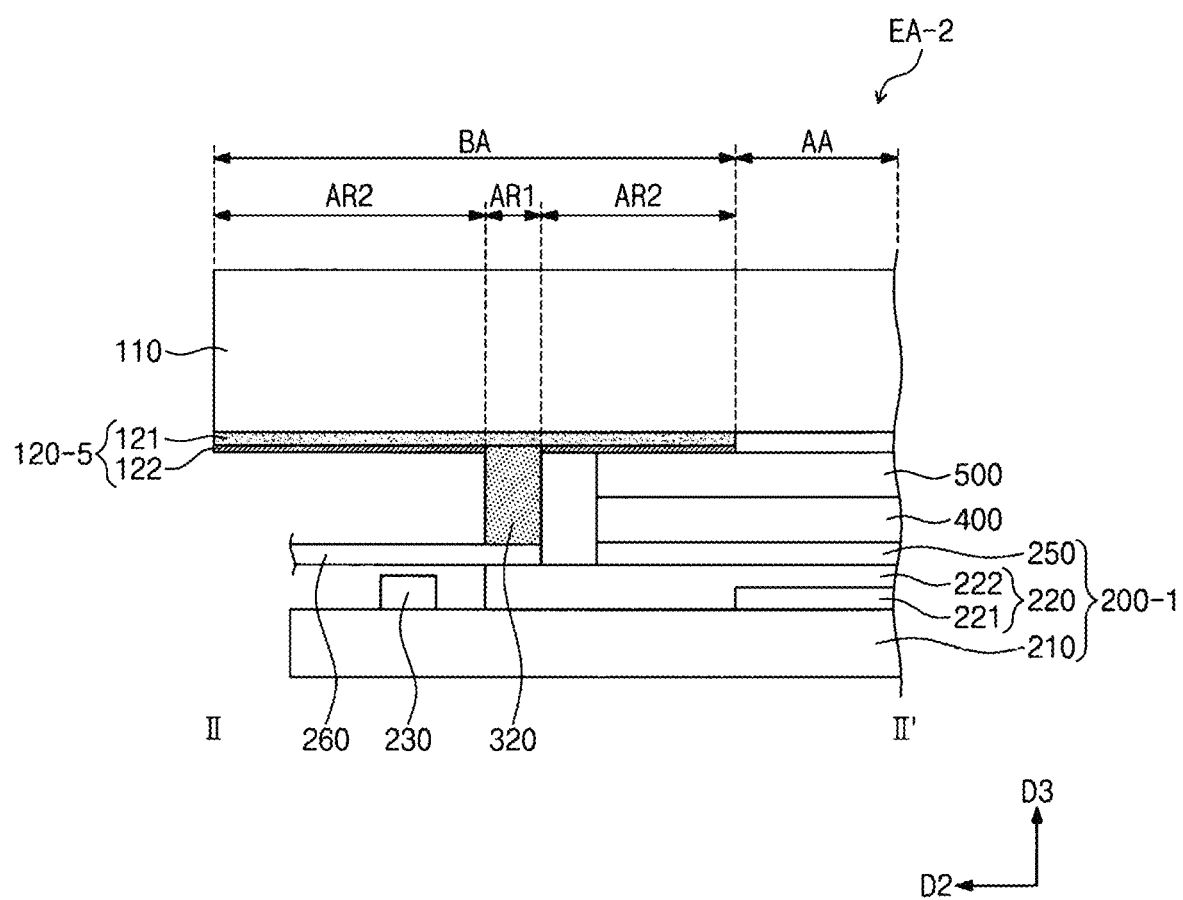

FIG. 12A is an exploded perspective view of a display apparatus according to an embodiment of the inventive concept. FIGS. 12B and 12C are cross-sectional views partially illustrating a state in which the display apparatus of FIG. 12A is assembled. A display apparatus EA-2 of FIG. 12A is illustrated to show the differences from the display apparatus EA-1 (see FIG. 10A), and cross-sectional views of different areas are respectively illustrated in FIGS. 12B and 12C. Hereinafter, the display apparatus EA-2 according to an embodiment of the inventive concept will be described with reference to FIGS. 12A to 12C.

Here, the same components as those of the display apparatus EA-1 of FIG. 10A may be included in FIG. 12A, except for a filling member 300-2 and a bezel part 120-5. Hereinafter, the same reference numeral may be given to components that are the same as those of FIGS. 1 to 11, and their duplicated descriptions will be omitted.

As illustrated in FIG. 12A, a display apparatus EA-2 may include the filling member 300-2 having a plurality of parts separated from each other. The filling member 300-2 includes a first filling member 310 and a second filling member 320. FIG. 12B illustrates a cross-sectional view of a region in which the first filling member 310 is disposed (FIG. 12B is a cross-sectional view taken along a line I-I' in FIG. 12A), and FIG. 12C illustrates a cross-sectional view of a region in which the second filling member 320 is disposed (FIG. 12C is a cross-sectional view taken along a line II-II' in FIG. 12A).

Referring to FIGS. 12A and 12B, the first filling member 310 is disposed on a display member 200-1. The first filling member 310 is disposed between a base substrate 210 (or be named as "base part") and a window member 100-6 to reinforce a space between the base substrate 210 and the window member 100-6. The first filling member 310 supports a region of the window member 100-6 that overlaps a first driving circuit 230. The first filling member 310 may cover at least a portion of the first driving circuit 230.

Referring to FIGS. 12A and 12C, the second filling member 320 is disposed on the display substrate 200-1. The second filling member 320 is disposed between a detection driving circuit 260 and the window member 100-6 to reinforce a space between the detection driving circuit 260 and the window member 100-6. Accordingly, the second filling member 320 may have a thickness relatively smaller than that of the first filling member 310.

The second filling member 320 may support a region of window member 100-6 that overlaps the detection driving circuit 260, an encapsulation layer 222, and the base substrate 210. The second filling member 320 may cover at least a portion of the detection driving circuit 260 that is disposed on the encapsulation layer 222.

Referring FIGS. 12B and 12C, the bezel part 120-5 may include a first layer 121 and a second layer 122. The first layer 121 may contact a transparent part 110. The first layer 121 may have a predetermined color. The first layer 121 may be a layer that determines a color of a bezel area BA. The first layer 121 may correspond to a layer including the first layer BZL1 and the second layer BZL2 of FIG. 8A.

The second layer 122 is disposed between the first layer 121 and an adhesion member 500. The second layer 122 may have a surface that defines a rear surface of the bezel part 120-5. The rear surface of the bezel part 120-5 may be a contact surface that contacts each of the first filling member 310 and the second filling member 320.

The bezel part 120-5 may contact each of the first filling member 310 and the second filling member 320 in a first area AR1. Therefore, in the current embodiment, the first area AR1 may be provided in plurality spaced apart from each other.

The first area AR1 may be defined through openings of the second layer 122 that respectively overlap the first filling member 310 and the second filling member 320. Accordingly, the first area AR1 may be provided in regions of the first layer 121 that are exposed through the second layer 122.

The first filling member 310 and the second filling member 320 may not overlap a second area AR2. The second area AR2 may be defined by the second layer 122. Accordingly, the first area AR1 and the second area AR2 may be defined on different layers.

According to an embodiment of the inventive concept, the display apparatus EA-2 includes the plurality of the filling members, and thus may stably support a gap between the window member 100-6 and the display member 200-1. The display apparatus EA-2 includes the first filling member 310 that supports the space above the first driving circuit 230 and the second filling member 320 that supports the space above the detection driving circuit 260 that are independently disposed from each other, and thus may stably protect the driving circuits disposed on different layers and flexibly reinforce various spaces between the window member 100-6 and the display member 200-1.

Figure 13A:
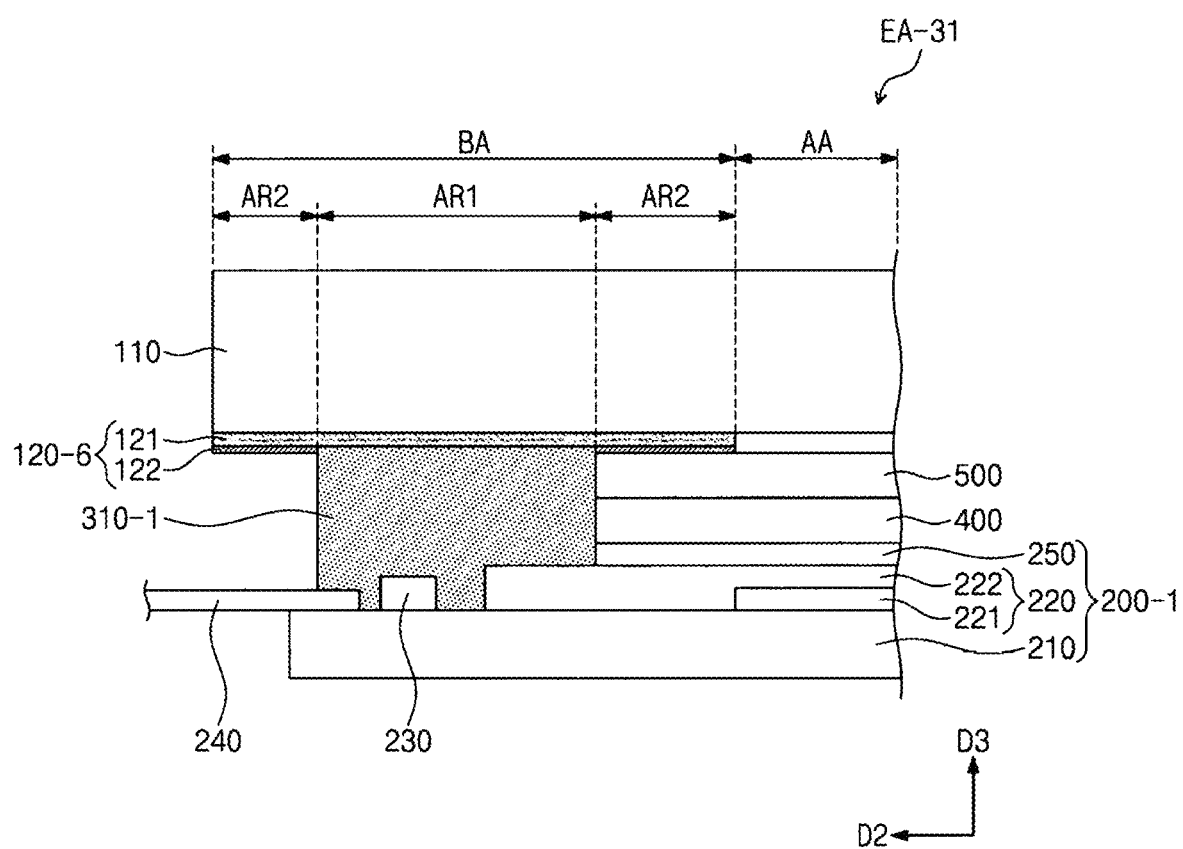
FIGS. 13A to 13C are cross-sectional views of display apparatuses according to embodiments of the inventive concept.
Figure 13B:
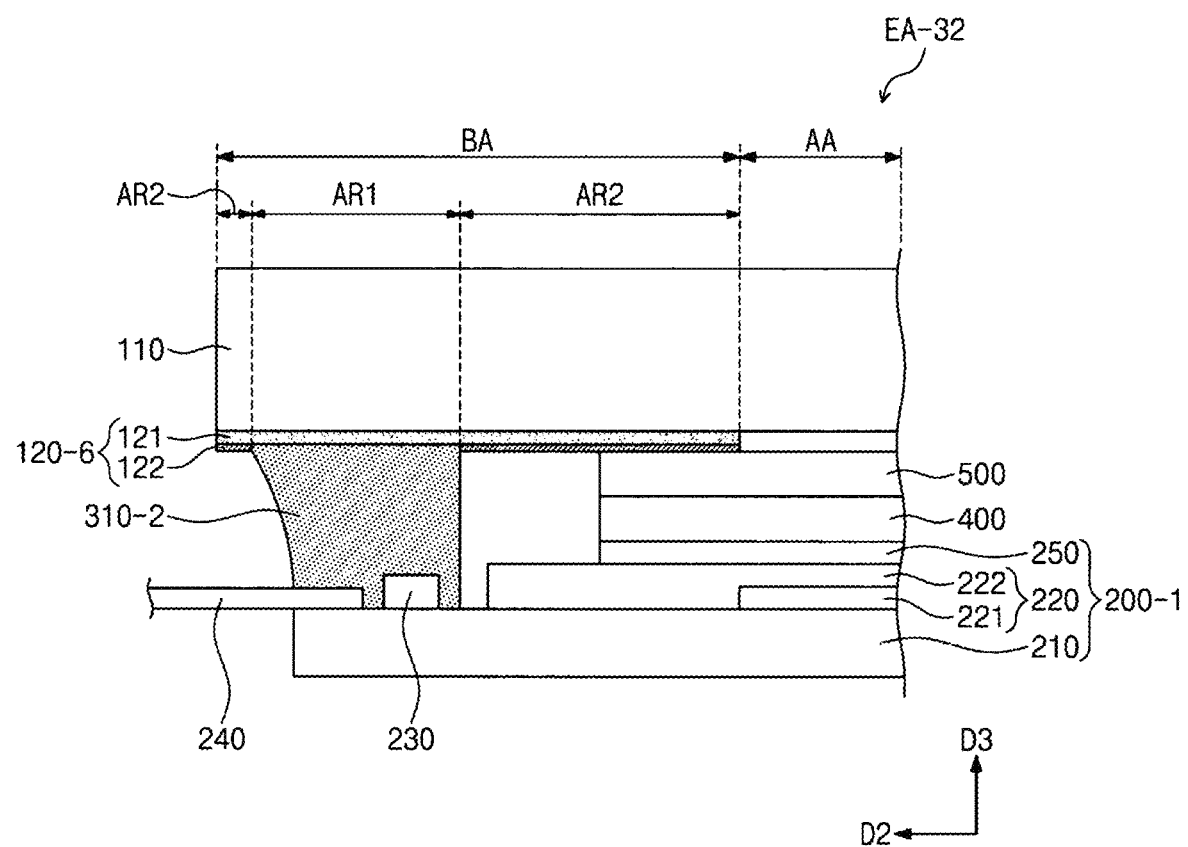
Figure 13C:
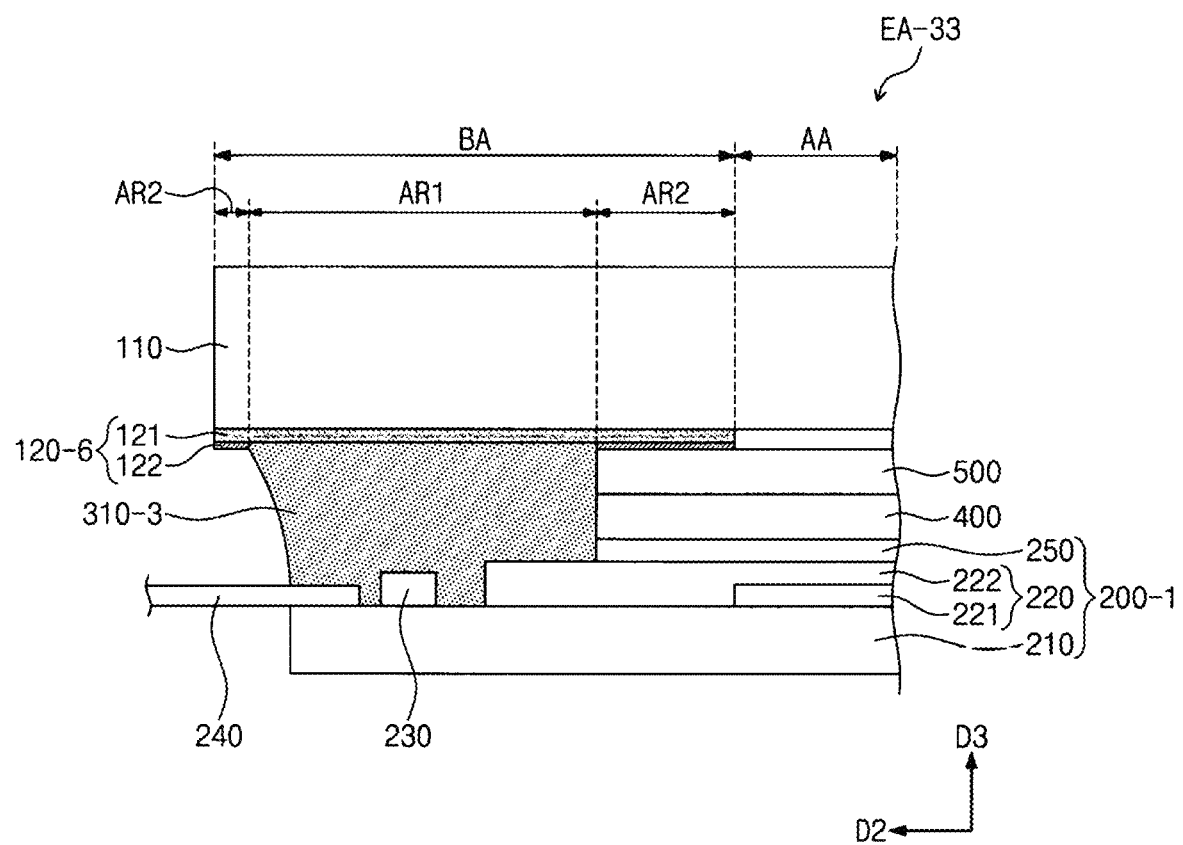

FIGS. 13A to 13C are cross-sectional views of display apparatuses according to an embodiment of the inventive concept. For ease of description, a region corresponding to that of FIG. 12B is illustrated in each of FIGS. 13A to 13C. Hereinafter, display apparatuses EA-31, EA-32, and EA-33 according to an embodiment of the inventive concept will be described with reference to FIGS. 13A to 13C, respectively.

As illustrated in FIG. 13A, in the display apparatus EA-31, a first filling member 310-1 may extend to cover the top surface of an encapsulation layer 222. Accordingly, a first area AR1 may expand to overlap the encapsulation layer 222. The first filling member 310-1 may cover a base substrate 210, the encapsulation layer 222, and a first driving circuit 230. In this case, the first filling member 310-1 may also contact an optical member 400 and an adhesion member 500.

Alternatively, as illustrated in FIG. 13B, the display apparatus EA-32 may include a first filling member 310-2 having a portion that extends toward an outer side of a base substrate 210 on a plane. Accordingly, a first area AR1 may extend toward the outer side region of the base substrate 210 on a plane. In this case, a side surface of the first filling member 310-2 that is directed toward the outer side of the base substrate 210 may extend diagonally or be formed to have a curved surface in a third direction D3.

Alternatively, as illustrated in FIG. 13C, the display apparatus EA-33 may include a first filling member 310-3 that covers a base substrate 210, an encapsulation layer 222, and a first driving circuit 230. In this case, an outer surface of the first filling member 310-3 may have an inclined surface or a curved surface in a third direction D3.

In this case, the first filling member 310-3 may be filled in a space between a display member 200-1 and a window member, in a region overlapping a first driving circuit 230. Accordingly, the first filling member 310-3 may cover a base substrate 210, an encapsulation layer 222, and the first driving circuit 230, and may also contact an optical member 400 and an adhesion member 500.

The display apparatus according to an embodiment of the inventive concept may include various types of the filling members. The filling members may include various shapes to reinforce the space between the display member 200-1 and the window member and protect the driving circuits and are not limited to the exemplary embodiments.

Additionally, in the embodiment of the inventive concept, the adhesion layer ADL of FIG. 6A, the adhesion layer ADL-2 of FIG. 7, the adhesion layer ADL-3 of FIG. 8A, the adhesion layer ADL-4 of FIG. 9, and the second layer 122 of FIGS. 12B to 13C may have the substantially same structure as the adhesion layer ADL-1 of FIG. 5, so that the first portion of the touch surface which touches the filling member may have roughness lower than that of the second portion of the touch surface which is adjacent to the first portion.

According to an embodiment of the inventive concept, the gap between the window member and the display member is filled with the filling member, and thus the display member may be stably protected against external impacts. In addition, the coupling force between the window member and the accommodating member is enhanced, and thus the internal components may be protected from external moisture or contamination, to thereby enhance the reliability in use.

In addition, a portion of the window member has a decreased adhesion property, and thus the window member may be easily separated from other components. Accordingly, the replacement or reuse of the window member may be facilitated during the attachment/detachment process, and thus the process reliability may be enhanced, and process costs may be reduced.

Although described with reference to exemplary embodiments of the present disclosure, it will be understood that various changes and modifications of the present disclosure can be made by one skilled in the art or one having ordinary knowledge in the art without departing from the spirit and technical field of the present disclosure as hereinafter claimed.

Hence, the technical scope of the present disclosure is not limited to the detailed descriptions in the specification, but it should be determined only by reference of the claims.

What is claimed is:

1. A display apparatus comprising:
a display member comprising a base substrate and a plurality of pixels disposed on the base substrate to display an image;
a window member disposed on the display member and comprising a transparent part through which the image is transmitted and a bezel part disposed between the transparent part and the display member and contacting the transparent part; and
a filling member disposed between the window member and the base substrate and contacting the bezel part,
wherein the bezel part comprises a first layer contacting the transparent part and a second layer disposed between the first layer and the filling member,
wherein the second layer has an opening that overlaps the filling member in a plan view, and
wherein the filling member is disposed in the opening.

2. The display apparatus of claim 1, wherein the bezel part has a front surface contacting the transparent part and a rear surface opposite to the front surface,
wherein the rear surface of the bezel part is defined by a rear surface of the second layer and a surface exposed by the opening, and
wherein the filling member contacts the surface exposed by the opening.

3. The display apparatus of claim 2, wherein the filling member entirely fills the opening.

4. The display apparatus of claim 2, wherein the rear surface of the second layer has a surface area greater than that of the surface exposed by the opening.

5. The display apparatus of claim 2, wherein the second layer comprises:
a medium part having an adhesive material; and
a plurality of particles dispersed in the medium part,
wherein the rear surface of the second layer has an uneven surface formed by the particles.

6. The display apparatus of claim 1, wherein the second layer has an adhesive material.

7. The display apparatus of claim 6, wherein the first layer has a color,
wherein the second layer contacts the first layer and exposes a portion of a rear surface of the first layer through the opening, and
wherein the filling member contacts the portion of the rear surface of the first layer exposed through the opening.

8. The display apparatus of claim 1, further comprising a cover layer disposed on the surface exposed by the opening,
wherein the filling member contacts the cover layer.

9. The display apparatus of claim 8, wherein the cover layer is attached to the first layer, and
wherein the second layer is printed on the first layer.

10. The display apparatus of claim 1, wherein the filling member and the second layer do not overlap each other in a plan view.

11. The display apparatus of claim 1, further comprising an accommodating member that defines an internal space, accommodates the display member in the internal space, and is coupled to the window member,
wherein the accommodating member contacts the second layer.

12. The display apparatus of claim 11, wherein the second layer further comprises an adhesive material, and
wherein the accommodating member is attached to the second layer.

13. The display apparatus of claim 1, wherein the filling member has an adhesive material.

* * * * *